PRESET MULTICHANNEL TUNING ASSEMBLY

Filed Aug. 3, 1970 2 Sheets-Sheet 1

INVENTOR
MEIGS W. NEWBERRY
BY [signature]
ATTORNEY

INVENTOR
MEIGS W. NEWBERRY

BY James and Franklin
ATTORNEY

United States Patent Office 3,621,722

Patented Nov. 23, 1971

3,621,722

PRESET MULTICHANNEL TUNING ASSEMBLY

Meigs W. Newberry, East Longmeadow, Mass., assignor to General Instrument Corporation, Newark, N.J.

Filed Aug. 3, 1970, Ser. No. 60,334

Int. Cl. F16h 35/18

U.S. Cl. 74—10.8 30 Claims

ABSTRACT OF THE DISCLOSURE

A multichannel tuning assembly of the preset type is provided for use with television receivers and like devices, in which the fine tuning adjustment mechanism, once engaged with the operative tuning element, permits continuous uninterrupted tuning in both clockwise and counterclockwise directions. Tuning elements on a body, or turret-type carrier, are adjusted by rotation of a tuning wheel, the initial rotation of which in either direction causes adjusting means to engage with the tuning elements, and the subsequent rotation of which continuously fine tunes a given station in both directions. The initial rotation actuates control means which lowers the adjusting means into driving engagement with the tuning elements which can then be adjusted without "play" or lost motion. Rotation of the coarse tuner or station selector disengages the adjusting means and resets the control means, as well as rotating the next sequential tuning element to the tuning station.

The present invention relates to a multichannel tuning assembly of the preset type such as may be employed in a television receiving unit, in which means are provided for continuous fine tuning, so as to adjustably preset the tuning elements for the individual stations.

It is common to utilize a plurality of individually adjustable tuning elements mounted on a movable support or turret, wherein one tuning element and then another is moved to an operative station, and inserted into a tuning circuit, as determined by the position of the station selector. Means are usually provided to preset or fine tune the particular tuning element in the operative station at a given moment. While some prior art embodiments required translational movement of the fine tuning knob to engage the fine-tuning adjustment mechanical, followed by rotational movement to accomplish the desired adjustment, other embodiments have accomplished both tasks only with rotation of the fine tuning knob. However, in the prior art embodiments, the adjustment mechanism only remains engaged with the tuning element at a given station during rotation in a given direction. When the tuning wheel rotation direction is changed, the adjustment mechanism disengages from the tuning element and then reengages for adjustment in the other direction. As a consequence prior art embodiments have been difficult or inconvenient to tune since there is considerably "play" or lost motion in the tuning operation. The present invention, therefore, is directed toward a mechanism which permits continuous fine tuning once the adjusting mechanism is engaged with the tuning element at a given station. Changes in tuning direction are accommodated with no lost motion or disengagement of the adjusting mechanism, permitting an accurate and rapid adjustment. Furthermore, the structural and operational characteristics of the assembly are such as to ensure that the tuning element setting remains undisturbed until it is deliberatly reset by the viewer.

It is a prime object of the present invention to provide a tuning assembly which eliminates lost tuning motion and which can be continuously tuned irrespective of tuning direction changes.

It is another object of the present invention to provide a tuning assembly in which the fine tuning knob requires only rotational movement both to initiate engagement of the adjusting mechanism with the tuning element and to adjust that element.

A further object of the present invention is to provide a tuning assembly in which the individual preset tuning elements are undisturbed in their settings during station selecting manipulations.

Yet another object of the present invention is the provision of a tuning assembly in which the fine tuning adjustment mechanism is disengaged from the individual tuning elements by the coarse tuner or station selector.

Specifically, a coarse tuner or station selector has a shaft movably mounted on a support. Movement of that shaft rotates a turret-like support to bring a selected one of a plurality of tuning elements into an operative station where it is electrically connected into the tuning system. A fine tuning knob is as provided, and by means of a gear arrangement the fine tuning knob transmits rotational motion to an adjusting shaft which is mounted on an upper portion of the support. The adjusting shaft is rotatable about its own axis and is also vertically shiftable. A pawl manner movably mounted on the support contacts and supports a knurled wheel which is attached to the adjusting shaft. Rotation of the knurler wheel causes the pawl member to rotate and permits the knurled wheel to travel down the periphery thereof. This causes the adjusting shaft to shift downwardly. With that downward shift a gear attached to the adjusting shaft in the vicinity of the knurled wheel engages a pinion connected to the tuning element then in the operative station. Once the gear and the pinion are engaged, the selected tuning element can be rotated in any direction by continued rotation of the fine tuning wheel without any lost motion. In other words, the gear and pinion remain engaged regardless of changes in the direction of rotation of the tuning wheel.

The element carrier is supported by, and is rotatable about, a coarse tuning shaft. A disc attached to the coarse tuning shaft has a circumferential slot therein, which slot loosely receives a finger which extends from the tuning element carrier. Rotation of the coarse tuner rotates the disc, which, upon taking up lost motion deriving from the slot-finger connection, rotates the tuning element carrier. A series of cam surfaces formed on the periphery of both the disc and the tuning element carrier sequentially disengage the gear from the pinion, raise the adjusting shaft a sufficient distance for a spring to rotate the pawl member to its normally upright position, and then lower the adjusting shaft so that the pawl member once again supports the knurled wheel. The lost motion between the disc and the tuning element carrier is not completely taken up until the gear is completely disengaged and free of the pinion, ensuring that the tuning element setting will remain undisturbed during coarse tuning.

To the accomplishment of the above, and to such other objects as may hereinafter appear, the present invention relates to a tuning assembly providing for continuous fine tuning of individually selectable tuning elements, as defined in the appended claims, and as described in this specification, taken together with the accompanying drawings in which:

Figure 1:
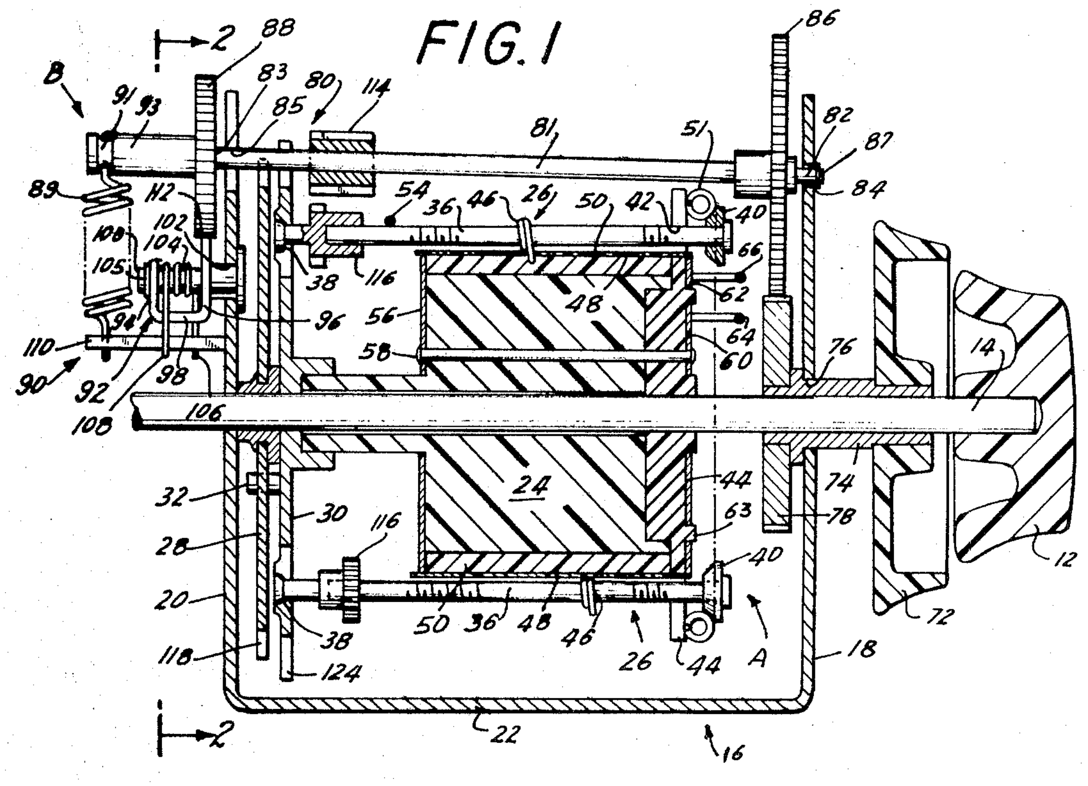
FIG. 1 illustrates a partially cross sectional front elevational view of a preferred embodiment in a selected coarse tuning position and with the fine tuning mechanism disengaged from the tuning element at the operative station.

The preset multichannel tuning assembly illustrated in FIG. 1 comprises a coarse tuning assembly A and a fine tuning assembly B. The assembly A effects coarse tuning by sequentially moving selected tuning elements to an operative station where they are inserted into the tuning circuit, and where, if necessary, they can be fine-tuned for optimum reception. The fine tuning assembly B can be selectively engaged with the tuning element at the operative station for the necessary fine tuning. Once engaged, the assembly B provides for continuously uninterrupted fine tuning, without lost motion even if the direction of fine tuning be reversed.

Turning first to the coarse tuning, the overall assembly is mounted on a support 16 which comprises side walls 18 and 20 and bottom wall 22. To describe the coarse tuning assembly A first, it comprises a selector shaft 14 journalled in side walls 18 and 20 and having coarse tuning knob 12 fast on its end exposed outside the side wall 18.

Mounted on shaft 14, but not driven thereby, is a turret-like body or carrier 24 which carries a plurality of tuning elements 26 (one for each station to be tuned), which elements are substantially parallel to the selector shaft 14. A disc member 28 is fixedly mounted on shaft 14 between side wall 20 and a second disc member 30, the member 30 being freely rotatably mounted on shaft 14. A finger 32 is integral with, and extends from, disc member 30 into a slot 34 (FIGS. 2 and 3) formed in disc member 28.

Figures 2, 3:
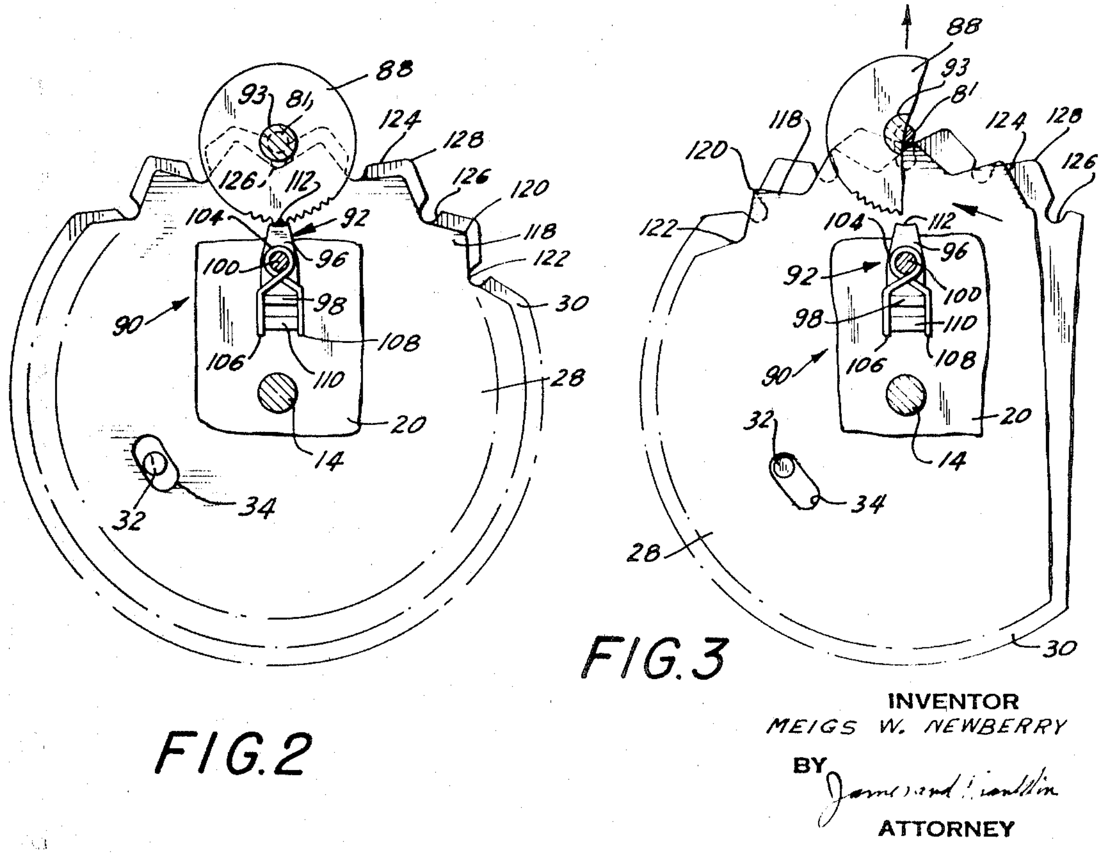
FIG. 2 is a cross sectional view taken along the line 2—2 of FIG. 1 and with the peripheral portions of the side wall of the support broken away.
FIG. 3 is a fragmentary view similar to FIG. 2, illustrating a position of the adjusting shaft as it is being cammed during the "station select" manipulation.
Figure 4:
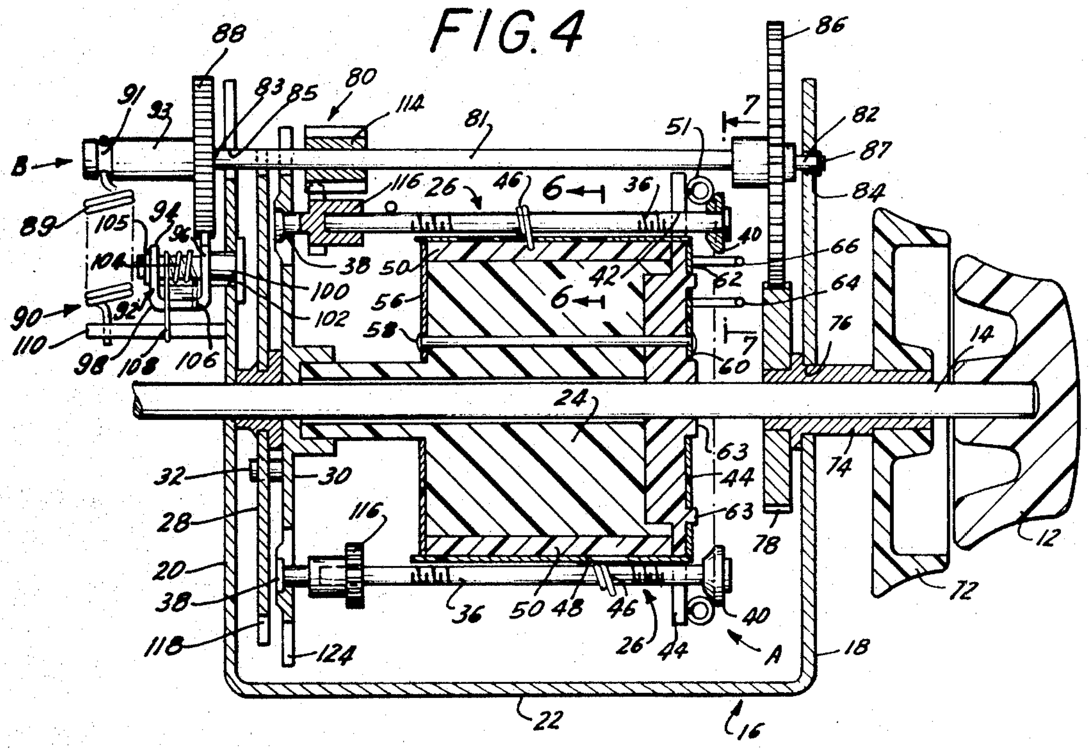
FIG. 4 is a view similar to FIG. 1, but showing the fine tuning mechaism engaged with the tuning element at the operative station.

To effect coarse tuning, the knob 12 is rotated either clockwise or counterclockwise, which rotation is transmitted to disc member 28. As shown in FIG. 3, after sufficient rotation, one or another of the ends of slot 34 (depending upon the direction of rotation) contact the finger 32 and cause the body 24 to rotate, thereby bringing another tuning element 26 to the operative station shown at the top of FIGS. 1 and 4, where it is inserted into the tuning circuit, thereby to tune the set to the particular frequency associated with the newly operative tuning element 26.

Detenting of the body 24 in one or another of its operative positions may be accomplished in any appropriate manner, as desired, but one advantage of the present invention is that the fine tuning assembly B itself provides the detenting and positive locating of the body 24 in each of its operative positions, as will become apparent in the description of the fine tuning assembly B which follows.

Figure 6:
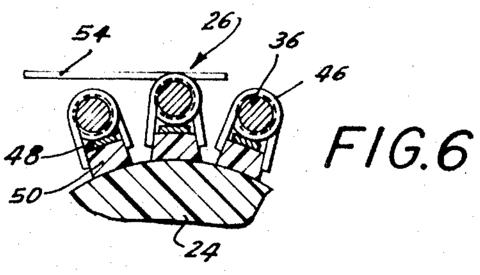
FIG. 6 is a cross sectioned fragmentary view of the tuning elements taken along the line 6—6 of FIG. 4.

The tuning elements 26, more specifically described in the copending application Ser. No. 44,160, filed June 8, 1970, entitled Variable Resistor and assigned to the assignee of this patent, comprise a conductive threaded member 36 which has a first enlarged end 38 mounted in disc member 30, and a second enlarged end 40 mounted in a slot 42 (see FIG. 7) in peripheral portion 44 of body 24. A conductive contact spring 46 is wound about and closely received within the threads of member 36, and a part of that spring is in constant electrical engagement with a resistive strip 48 which is mounted on base 50 (FIG. 6). Rotation of member 36 slides the contact spring 46 along resistive strip 48. The spring 51 on base 44 acts on enlarged end 40 urging the member 36 downwardly. Additionally, the spring 51 fixes the longitudinal position of member 36 with respect to body 24 by urging it to the right as viewed in FIGS. 1 and 4 until enlarged end 38 of member 36 engages disc member 30, thereby ensuring against unintentional changes in the position of that contact spring on that resistive strip.

Figure 7:
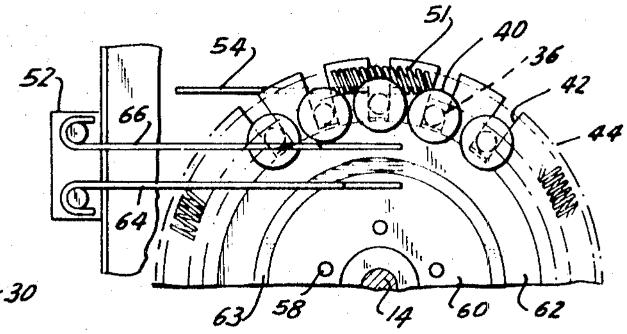
FIG. 7 is an enlarged fragmentary view taken along the line 7—7 of FIG. 4.

The tuning element 26 essentially forms a potentiometer assembly the three electrical terminals of which are the two ends of the resistive strip 48 and the contact spring 46. Referring to FIGS. 1, 6 and 7, the contact spring 46 of the operative tuning element 26 is electrically connected to the terminal box 52 by means of the conductive member 36 and a conductive resilient brush 54 extending from the control box 52 and resiliently downwardly biased into physical engagement with the member 36 of the tuning element 26 then in operative position. Continuous collector ring 60 is mounted on the exposed right hand end of carrier 24 and is electrically connected to conductive element 58 which passes through carrier 24 and engages collector ring 56 on the left hand end of carrier 24, the ring 56 electrically engaging the left hand ends of all of the resistive strips 48. Continuous collector ring 62 is also mounted on the exposed right hand end of the carrier 24 and is electrically connected to the right hand ends of the several resistive strips 48. Conductive resilient brushes 64 and 66 extend from the terminal box 52 and ride over the collector rings 60 and 62 respectively. The terminal box 52 is, of course, connected to external circuitry in any appropriate manner so as to connect the operative tuning element into the tuning circuit.

For fine tuning adjustment of the operative tuning element 26, it is necessary to rotate the threaded member 36 so as to drive the contact spring 46 along the resistive strip 48, threeby to vary the voltage applied to contact spring 46. Additionally, it is advantageous for accurate and simple adjustment that the fine tuning assembly B have the facility for continuous and uninterrupted fine tuning, irrespective of tuning direction changes. In other words, it should be possible, during one fine tuning adjustment, to rotate threaded member 36 clockwise and counterclockwise without any lost motion. It is also desirable that a given tuning element 26 be fine-tuned while it is operative, so the results of the tuning can be observed and that when once fine-tuned it retain that adjustment so that new fine tuning will not be required next time that tuning element is rendeded operative. This is called preset tuning.

Turning now to a description of the fine tuning assembly B, fine tuning knob 72 is mounted on sleeve 74 which is rotatably mounted on shaft 14. Sleeve 74 extends through opening 76 in side wall 18 and has a gear 78 fixedly mounted thereon, adjacent the inner surface of side wall 18. Rotation of knob 72 causes sleeve 74 to rotate about shaft 14. It is to be noted that the fine tuning knob 72 and coarse tuning knob 12 act independently of each other, that is, rotation of one will not disturb the position of the other.

Driving or adjusting means generally designated 80 is mounted on an upper section of support 16. An adjusting shaft 81 has one end 82 extending through an opening 84 in side wall 18, and another end 83 extending through slot 85 in side wall 20. A retaining ring 87 on end 82 prevents that end from slipping out of opening 84, and there is substantial clearance between the walls of that opening and that end to permit tilting of that shaft about that end. To reversibly transmit the rotational motion of knob 72 to shaft 81, gear 86 is fixed to shaft 81. The gear 78 and gear 86 are in constant driving contact irrespective of the tilting of shaft 81. For purposes hereinafter described, a wheel 88, knurled on its periphery, is mounted on shaft 81 adjacent the outer surface of wall 20.

To selectively lower adjusting shaft 81, control means 90 is mounted on side wall 20. That means comprises a pawl member generally designated 92, having side sections 94 and 96 and a bottom section 98. That pawl is mounted, by its side sections 94 and 96, on pin 100 which is received in opening 102 in wall 20. A spring 104 having free ends 106 and 108 is wound about pin 100, and its free ends contact opposite sides of a horizontal post 110 which extends from wall 20. A retaining ring 105 on pin 100 holds pawl member 92 and spring 104 on pin 100. The pawl member 92 has an upwardly projecting top surface 112 (FIG. 3) which is substantially similar in curvature to the wheel 88. In its upright position (FIG. 2) pawl member 92 supports wheel 88, and therefore shaft 81. In its thus-supported position (see FIG. 1) the shaft 81 is inclined upwardly from right to left. It is urged downwardly, so that the wheel 88 firmly engages pawl surface 112, by means of spring 89 tensioned between post 110 and the left-hand end of shaft 81.

Figure 5:
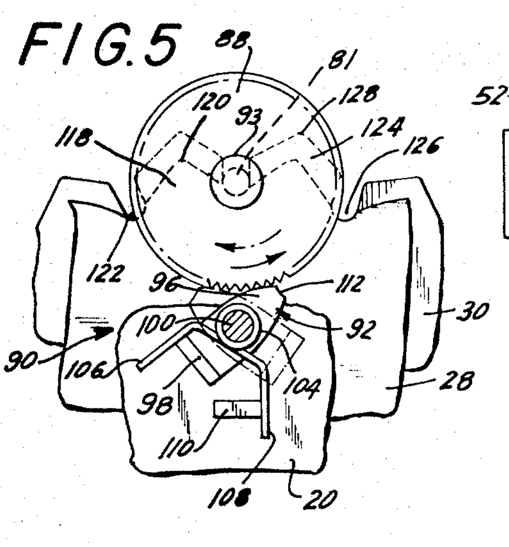
FIG. 5 is an enlarged fragmentary view of the adjusting shaft and pawl combination of FIGS. 2 and 3, showing their relative position corresponding to the condition shown in FIG. 4.

Rotation of knob 72 causes wheel 88 to rotate. Because of the engagement between wheel 88 and pawl surface 112, this causes pawl 92 to pivot about pin 100 against the action of spring 104. As shown in FIG. 5, pawl 92 can pivot in either direction depending upon the direction of rotation of wheel 88. Pivoting of the pawl 92 in either direction removes the radially projecting pawl part from engagement with the wheel 88, thus enabling the wheel 88 to move downwardly, thereby causing the shaft 81 to move down toward a horizontal position (see FIG. 4) which is the fine tuning adjustment position.

The shaft 81 carries a gear 114. Each of the threaded members 36 carries a pinion 116. When the shaft 81 is in its upwardly inclined position (FIG. 1) the gear 114 is disengaged from the pinion 116 of the operative tuning element 26, thereby permitting coarse tuning movement of the carrier 24. However, when the shaft 81 is released from the lifting action of pawl 92 and moves downwardly (FIG. 4), the gear 114 moves into engagement with the pinion 116, that movement and engagement being assisted and ensured by biasing spring 89. Once the gear114 and pinion 116 engage, continued rotation of knob 72 causes rotation of threaded member 36 and consequent fine tuning of the tuning elements 26. Change of direction of rotation of knob 72 produces no lost tuning motion since pawl member 92 remains in its pivoted position, the wheel 88 slidably rotating ineffectually over a side surface of the pawl 92 (see FIG. 5). The gear 114 and pinion 116 remain engaged, and therefore the operative tuning element 26 may be continuously and uninterruptedly fine tuned.

To provide the assembly 10 with compactness, the pinions 116 on the members 36 are staggered, that is, adjacent pinions 116 are in different planes. The gear 114 is elongated so as to contact all the pinions so staggered.

To change stations it is necessary to move the operative tuning element 26 from the tuning station and move a new tuning element 26 thereinto. This calls for disengagement of gear 114 from pinion 116 and subsequent rotation of carrier 24, all without disturbing the fine-tuning adjustment of the tuning element 26 about to leave the tuning station. To disengage gear 114 from pinion 116 it is necessary to raise shaft 81, and to permit carrier 24 to rotate, gear 81 must be held in raised position.

Accordingly, the disc 28 fast on coarse tuning shaft 14 is provided with a plurality of cams 118 (one for each tuning element 26) formed on its periphery as shown in FIGS. 2 and 3. The cams 118 comprise a series of hills 120 and valleys 122. Similarly, disc 30 rotatable on shaft 14 and fast with carrier 24 is provided with a plurality of cams 124 (again one cam 124 for each tuning element 26) formed on its periphery comprising hills 128 separated by the radial slots 126. Portion 83 of shaft 81 cooperates with the cams 118 and 124. When the carrier 24 is in an operative position the shaft 81 will be urged down into the corresponding radial slot 126 in disc 30, thereby positively indexing the carrier into its accurate position, and it will also be received in a valley 122 between a pair of hills on disc 28, thereby indexing that disc 28 into a position of rest, in which position finger 32 carried by disc 30 will be approximately midway of the length of slot 34. The shaft 81 will normally be raised above the bottom of slot 126 by pawl 92, but if the operative tuning element 26 has been fine-tuned it will be lower down in that slot 126 (compare FIGS. 2 and 5).

When coarse tuning knob 12 is first rotated disc 28 is rotated but disc 30 remains stationary, because finger 32 has not yet reached the end of slot 34. As disc 28 rotates shaft 81 will be cammed up, riding along the side of a cam hill 120, gear 114 will be disengaged from pinion 116, and shaft 81 will be lifted out of slot 126 in disc 30, all before carrier 24 starts to rotate.

As knob 12 continues to be turned, finger 32 will engage the end of slot 34 and carrier 24 will start to turn, carrying with it disc 30. A cam hill 128 on disc 30 will now engage shaft 81 and lift it still further (as may be seen from FIG. 2, the hills 128 on disc 30 extend out radially beyond the hills 120 on disc 28). At some appropriate point in this lifting movement of shaft 81 its end will be lifted higher than the normal position of the pawl surface 112, the pawl 92 will be released, and its spring 104 will return to its upright position shown in FIGS. 2 and 3. Thereafter when the shaft 81 is lowered and raised by cams 118 or 124 as the carrier 24 continues to rotate, the shaft is lowered onto the now upright pawl 92, and hence the gear 114 remains lifted above the path of travel of the pinion 116 as the carrier 24 rotates.

When the carrier 24 reaches its next position of rest, shaft 81, while its wheel 88 rests on pawl surface 114, enters the appropriate slot 126, thus indexing the carrier 24.

During rotation of body 24 the rings 60 and 62 slide past brushes 64 and 66 respectively, while threaded member 36 of the then operative tuning element 26 slides under the brush 54 until contact between them is broken. Concurrently, the threaded member 36 of the next sequential tuning element contacts brush 54 and slides under nt until that element 26 is positioned at the tuning station. The newly operative tuning element 26 is thus included in the electrical circuit of the receiver.

A primary advantage of the present invention is the feature of continuous and uninterrupted fine tuning, irrespective of direction change, and without lost motion, thereby greatly simplifying what has been an annoying task. Another advantage is that a single motion (rotation) of the tuning knob 72 serves to both engage and adjust the tuning elements 26. A still further advantage of this construction is the complete disengagement of the tuning elements 26 from the gear 114 prior to the rotation of the resident tuning elements 26 from the operative station. This ensures that the element setting remains undisturbed throughout the coarse tuning manipulations. It should be emphasized that fine tuning of the recited assembly is an entirely optional operation. For a wide range of operating conditions a tuning element 26, once set, may provide optimum reception over an extended period of time. However, it is possible, from time to time, that changes in transmission parameters may require additional tuning. The present invention considerably simplifies this task by the structure herein recited.

While but a single embodiment of the present invention is herein disclosed, it will be appreciated that many variations may be made in the details thereof, without departing from the spirit and scope of the invention, as defined in the appended claims.

I claim:

1. A tuning assembly comprising a support, station selector means movably mounted on said support, a body drivingly operatively connected to said station selector means, a plurality of individual operative tuning elements on said body, said station selector means moving said body to sequentially bring said tuning elements to an operative tuning station, adjusting means effective when engaged with the operative tuning element at said tuning station to tunably adjust the latter, said adjusting means being mounted on said support so as to be movable in a first manner between a position disengaged from said operative tuning element and a position engaged therewith, and being movable in a second manner to adjust said tuning elements when engaged therewith, control means movably mounted on said support between an operative position engaged with said adjusting means and active to hold it in said disengaged position and an inoperative position permitting said adjusting means to move to said engaged position, and an operative driving connection between said control means and said adjusting means sensitive to movement of said adjusting means in said second manner and effective to move said control means to said inoperative position when said adjusting means is moved in said second manner and to break said operative driving connection between said control means and said adjusting means, whereby said adjusting means remains in said engaged position despite movement thereof in said second manner in any direction.

2. The tuning assembly of claim 1, further comprising restoring means operatively connected between said station selector means, said adjusting means and said control means and effective when said station selector means is moved to restore (a) said adjusting means to its disengaged position, (b) said control means to its operative position, and (c) said driving connection to its operative status.

3. The tuning assembly of claim 2, in which said second manner of movement of said adjusting means is rotary movement, said adjusting means comprising a rotated mounted part which in its operative position engages the periphery of said rotated member and holds said member in a raised position corresponding to the disengaged position of said adjustment means, said operative connection between said adjusting means and said control means causing said part to pivot when said member is rotated, thereby enabling said rotated member to move to a lowered position corresponding to the engaged position of said adjusting means.

4. The tuning assembly of claim 2, in which said station selector means comprises a first shaft, said body is mounted on said first shaft, said adjusting means comprising a second shaft, said first manner of movement being toward and away from said first shaft corresponding to the engaged and disengaged positions respectively of said adjusting means with said tuning elements, said second manner of movement being rotation of said second shaft, said tuning assembly further comprising manual means for rotating said second shaft, said second shaft carrying a rotated member, biasing means urging said second shaft toward said first shaft, and said control means engages said rotated member, holds said adjusting means away from said tuning elements, and is driven by said rotated member to release the latter to move toward said tuning elements.

5. The tuning assembly of claim 4, said restoring means comprising a cam with hills and valleys operatively connected to said first shaft, lifting said second shaft to permit said control means to return to its operative position, then lowering it whereby said rotated member engages said control means and reestablishes the operative status of said driving connection.

6. The tuning assembly of claim 2, further including means effective upon movement of said station selector means to first actuate said restoring means and then move said body.

7. The tuning assembly of claim 6, in which said body has freedom of movement relative to said station selector means, said restoring means is directly driven by said station selector means, and including means effective to drive said body by said restoring means only after the latter has been moved a predetermined distance by said station selector means.

8. The tuning assembly of claim 1, in which said second manner of movement of said adjusting means is rotary movement, said adjusting means comprising a rotated member, said control means comprising a pivotally mounted part which in its operative position engages the periphery of said rotated member and holds said member in a raised position corresponding to the disengaged position of said adjustment means, said operative connection between said adjusting means and said control means causing said part to pivot when said member is rotated, thereby enabling said rotated member to move to a lowered position corresponding to the engaged position of said adjusting means.

9. The tuning assembly of claim 8, in which said part is spring-urged to its operative position.

10. The tuning assembly of claim 8, in which said part is spring urged to its operative position and can pivot in either direction therefrom.

11. The tuning assembly of claim 1, in which said station selector means comprises a first shaft, said body is mounted on said first shaft, said adjusting means comprises a second shaft, said first manner of movement being toward and away from said first shaft corresponding to the engaged and disengaged positions respectively of said adjusting means with said tuning elements, said second manner of movement being rotation of said second shaft, said tuning assembly further comprising manual means for rotating said second shaft, said second shaft carrying a rotated member, biasing means urging said second shaft toward said first shaft, and said control means engages said rotated member, holds said adjusting means away from said tuning elements, and is driven by said rotated member to release the latter to move toward said tuning elements.

12. The tuning assembly of claim 11, said control means comprising a pivotally mounted part which in its operative position engages the periphery of said rotated member and holds said member in its raised position corresponding to the disengaged position of said adjusting means, said operative connection between said adjusting means and said control means causing said part to pivot when said member is rotated, thereby enabling said member to move to a lower position corresponding to the engaged position of said adjusting means.

13. The tuning assembly of claim 12, in which said part is spring-urged to its operative position.

14. The tuning assembly of claim 12, in which said part is spring urged to its operative position and can pivot in either direction therefrom.

15. The tuning assembly of claim 11, further comprising restoring means operatively connected between said station selector means, said adjusting means and said control means, and effective when said station selector means is moved to restore said adjusting means to its disengaged position, said control means to its operative position, and said driving connection to its operative status.

16. The tuning assembly of claim 15, said restoring means comprising a cam with hills and valleys operatively connected to said first shaft, lifting said second shaft to permit said control means to return to its operative position, then lowering it whereby said rotated member engages said control means and reestablishes the operative status of said driving connection.

17. In an assembly comprising a driven member and a normally disengaged driving member both movably mounted on a support, said driving member being movable in a first manner between a position disengaged from said driven member and a position engaged therewith, and being movable in a second manner to drive said driven member when engaged therewith; the improvement which comprises control means movably mounted on said support between an operative position engaged with said driving member and active to hold it in said disengaged position and an inoperative position permitting said driving member to move to said engaged position, and an operative driving connection between said control means and said driving member sensitive to movement of said driving member in said second manner and effective to move said control means to said inoperative position when said driving member is moved in said second manner and to break said operative driving connection, whereby said driving member remains in said engaged position despite movement thereof in said second manner in any direction.

18. In the assembly of claim 17, restoring means operatively connected between said driving member and said control means and effective when moved to restore (a) said driving member to said disengaged position, (b) said control means to its operative position, and (c) said driving connection to its operative status.

19. In the assembly of claim 18, in which said second manner of movement of said driving member is rotary movement, said driving member comprising a rotated member, said control means comprising a pivotally mounted part which in its operative position engages the periphery of said rotated member and holds said member in a raised position corresponding to the disengaged position of said driving member, said operative connection between said driving means and said control means causing said part to pivot when said member is rotated, thereby enabling said rotated member to move to said lowered position corresponding to the engaged position of said driving means.

20. In the assembly of claim 18, said driving means comprising a shaft, said first manner of movement being toward and away from said driven member corresponding to the engaged and disengaged positions respectively of said driving member with said driven member, said second manner of movement being rotation of said shaft, said assembly further comprising manual means for rotating said shaft, said shaft carrying a rotated member, biasing means urging said shaft toward said driven member, and said control means engages said rotated member, holds said driving member away from said driven member, and is driven by said rotated member to release the latter to move toward said driven member.

21. In the assembly of claim 20, said restoring means comprising a cam with hills and valleys lifting said driving member to permit said control means to return to its operative position, then lowering it whereby said rotated member engages said control means and reestablishes the operative status of said driving connection.

22. In the assembly of claim 17, in which said second manner of movement of said driving member is rotary movement, said driving member comprising a rotated member, said control means comprising a pivotally mounted part which in its operative position engages the periphery of said rotated member and holds said member in a raised position corresponding to the disengaged position of said driving member, said operative connection between said driving means and said control means causing said part to pivot when said member is rotated, thereby enabling said rotated member to move to said lowered position corresponding to the engaged position of said driving means.

23. In the assembly of claim 22, in which said part is spring-urged to its operative position.

24. In the assembly of claim 22, in which said part is spring-urged to its operative position and can pivot in either direction therefrom.

25. In the assembly of claim 17, said driving means comprising a shaft, said first manner of movement being toward and away from said driving member corresponding to the engaged and disengaged positions respectively of said driving member with said driven member, said second manner of movement being rotation of said shaft, said assembly further comprising manual means for rotating said shaft, said shaft carrying a rotated member, biasing means urging said shaft toward said driven member, and said control means engages said rotated member, holds said driving member away from said driven member, and is driven by said rotated member to release the latter to move toward said driven member.

26. In the assembly of claim 25, said control means comprising a pivotally mounted part which in its operative position engages the periphery of said rotated member and holds said member in its raised position corresponding to the disengaged position of said driving member, said operative connection between said driving member and said control means causing said part to pivot when said member is rotated, thereby enabling said member to move to a lower position corresponding to the engaged position of said driving member.

27. In the assembly of claim 26, in which said part is spring-urged to its operative position.

28. In the assembly of claim 26, in which said part is spring-urged to its operative position and can pivot in either direction therefrom.

29. In the assembly of claim 25, comprising restoring means operatively connected between said driving means and said control means, and effective when moved to restore (a) said driving member to its disengaged position, (b) said control means to its operative position and (c) said driving connection to its operative status.

30. In the assembly of claim 29, said restoring means comprising a cam with hills and valleys lifting said driving member to permit said control means to return to its operative position, then lowering it whereby said rotated member engages said control means and reestablishes the operative status of said driving connection.

References Cited

UNITED STATES PATENTS

| | | | |
|---|---|---|---|
| 3,175,407 | 3/1965 | Reinwall, Jr. | 74—10.8 |
| 3,415,128 | 12/1968 | Smart | 74—10.54 X |

MILTON KAUFMAN, Primary Examiner

U.S. Cl. X.R.

74—10.45; 334—1